(12) United States Patent
Chin (10) Patent No.: US 9,205,626 B2
(45) Date of Patent: Dec. 8, 2015

(54) DISPLAY DEVICE

(71) Applicant: Heung-Suk Chin, Yongin (KR)

(72) Inventor: Heung-Suk Chin, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 181 days.

(21) Appl. No.: 13/962,941

(22) Filed: Aug. 8, 2013

(65) Prior Publication Data

US 2014/0044930 A1 Feb. 13, 2014

(30) Foreign Application Priority Data

Aug. 13, 2012 (KR) .......................... 10-2012-0088594

(51) Int. Cl.
*B32B 3/02* (2006.01)
*G09G 3/32* (2006.01)
*C09J 5/10* (2006.01)
*H05K 5/02* (2006.01)

(52) U.S. Cl.
CPC .. *B32B 3/02* (2013.01); *G09G 3/32* (2013.01); *C09J 5/10* (2013.01); *H05K 5/0243* (2013.01); *Y10T 428/24777* (2015.01)

(58) Field of Classification Search
CPC ....................................................... B32B 3/02
See application file for complete search history.

(56) References Cited

U.S. PATENT DOCUMENTS

| 2010/0151211 A1* | 6/2010 | Kodaira et al. ............... 428/192 |
| 2012/0007057 A1* | 1/2012 | Choi et al. ....................... 257/40 |
| 2012/0224118 A1* | 9/2012 | Kanzaki et al. ................ 349/58 |

FOREIGN PATENT DOCUMENTS

| JP | 3523118 B2 | 2/2004 |
| JP | 2006-234974 A | 9/2006 |
| KR | 10-2011-0015128 A | 2/2011 |
| WO | WO 2011058679 A1 * | 5/2011 |

OTHER PUBLICATIONS

English Patent Abstracts of Japan No. 2001-033623 B2 which corresponds to JP 3523118, 1 page.

* cited by examiner

*Primary Examiner* — David Sample
*Assistant Examiner* — Christopher Polley
(74) *Attorney, Agent, or Firm* — Christie, Parker & Hale, LLP (57) ABSTRACT

A display device including a first substrate including a first wave-shaped edge; a display positioned on the first substrate and displaying an image; and a second substrate positioned on the first substrate with the display interposed therebetween and including a second wave-shaped edge bonded to the first wave-shaped edge and corresponding to the first wave shaped edge.

10 Claims, 9 Drawing Sheets

DISPLAY DEVICE

CROSS-REFERENCE TO RELATED APPLICATION

This application claims priority to and the benefit of Korean Patent Application No. 10-2012-0088594 filed in the Korean Intellectual Property Office on Aug. 13, 2012, the entire content of which is incorporated herein by reference.

BACKGROUND

1. Field

Embodiments of the present invention relate to a display device.

2. Description of the Related Art

A display device is a device for displaying an image, and an organic light emitting diode (OLED) display has recently drawn attention.

The organic light emitting diode display has a self light-emitting characteristic, and does not require a separate light source, which is unlike a liquid crystal display device, thereby reducing a thickness and a weight thereof. Further, the organic light emitting diode display exhibits high definition characteristics, low power consumption, high luminance, a high reaction speed, and the like.

The organic light emitting diode display may include a first substrate, an organic light emitting diode positioned on the first substrate, and a second substrate positioned on the first substrate with an organic light emitting diode interposed therebetween.

A thin flexible organic light emitting diode display, in which a first substrate and a second substrate are constituted by a flexible film, has been recently developed.

The above information disclosed in this Background section is only for enhancement of understanding of the background of the described technology and therefore it may contain information that does not form the prior art that is already known in this country to a person of ordinary skill in the art.

SUMMARY

Embodiments of the present invention provide a flexible display device having improved impact resistance.

An exemplary embodiment of the present invention provides a display device, including: a first substrate having a first wave-shaped edge; a display on the first substrate and configured to display an image; and a second substrate on the first substrate with the display interposed therebetween, and having a second wave-shaped edge bonded to the first wave-shaped edge and corresponding to the first wave-shaped edge.

The first wave-shaped edge may include: a plurality of first protruding portions each protruding in a curved shape; and a plurality of first depressed portions each between corresponding first protruding portions, and the first protruding portions and the first depressed portions may be disposed alternately to each other.

The second wave-shaped edge may include: a plurality of second protruding portions each protruding in a curved shape; and a plurality of second depressed portions each between corresponding second protruding portions, and the second protruding portions and the second depressed portions may be disposed alternately to each other.

The display includes a plurality of pixels, each pixel being a minimum unit for displaying the image, and each first protruding portion and each second protruding portion may have a width corresponding to a width of one pixel of the pixels.

The display device may further include a reinforcing agent attached to the first wave-shaped edge and the second wave-shaped edge.

The reinforcing agent may have a first reinforcing edge in a straight line.

The reinforcing agent may have a second wave-shaped reinforcing edge corresponding to the first wave-shaped edge and the second wave-shaped edge.

The display may include an organic light emitting diode.

The first substrate and the second substrate may each include a flexible film.

According to the exemplary embodiments, a flexible display device having improved impact resistance is provided.

DETAILED DESCRIPTION

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Accordingly, the drawings and description are to be regarded as illustrative in nature and not restrictive. Like reference numerals designate like elements throughout the specification.

Further, in exemplary embodiments, since like reference numerals designate like elements having the same configuration, a first exemplary embodiment is representatively described, and in other exemplary embodiments, only a configuration different from the first exemplary embodiment may be described.

In addition, the size and thickness of each configuration shown in the drawings are arbitrarily shown for understanding and ease of description, but the present invention is not limited thereto. That is, in the drawings, the thickness of layers, films, panels, regions, etc., and areas may be exaggerated for clarity.

It will be understood that when an element such as a layer, film, region, or substrate is referred to as being "on" another element, it can be directly on the other element, or one or more intervening elements may be interposed therebetween. In addition, in the specification, the word "on" means positioning on or below the object portion, but does not essentially mean positioning on the upper side of the object portion based on a gravity direction.

Further, unless explicitly described to the contrary, the word "comprise" and variations such as "comprises" or "comprising", will be understood to imply the inclusion of stated elements but not the exclusion of any other elements.

Hereinafter, a display device according to a first exemplary embodiment will be described with reference to FIGS. 1 to 4. An organic light emitting diode (OLED) display including an active matrix (AM) type organic light emitting diode having a 2Tr-1Cap structure in which a display has two thin film transistors (TFT) and one capacitor per pixel will be described as an example, but the present invention is not limited thereto. Therefore, the display device may be an organic light emitting diode display including an organic light emitting diode in which a display includes at least three thin film transistors and at least two capacitors per pixel, a liquid crystal display device in which a display includes liquid crystals, a plasma display panel (PDP) in which a display includes plasma, or the like. Here, the pixel indicates a minimum unit of displaying an image, and the display of the display device displays an image through a plurality of pixels.

Figure 1:
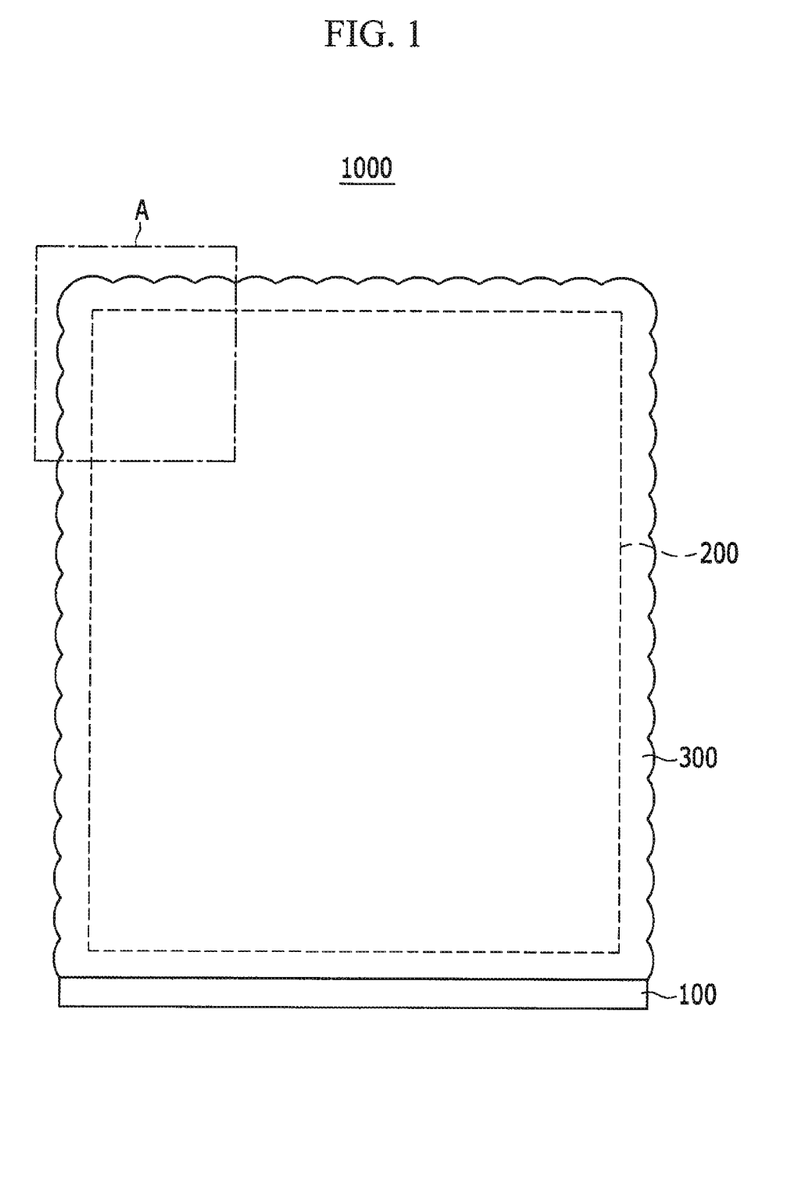
FIG. 1 is a diagram illustrating a display device according to a first exemplary embodiment.

FIG. 1 is a diagram illustrating a display device according to a first exemplary embodiment.

As illustrated in FIG. 1, a display device 1000 according to the first exemplary embodiment includes a first substrate 100, a display 200, and a second substrate 300.

The first substrate 100 and the second substrate 300 may include a flexible film made of, for example, an organic material, such as a resin and the like. However, one or more of the first substrate 100 and the second substrate 300 may be made of an inorganic material, such as glass, a metal material, or the like. The first substrate 100 and the second substrate 300 may have a light-transmitting property or a light-blocking property, and the display 200 is located between the first substrate 100 and the second substrate 300.

Figure 2:
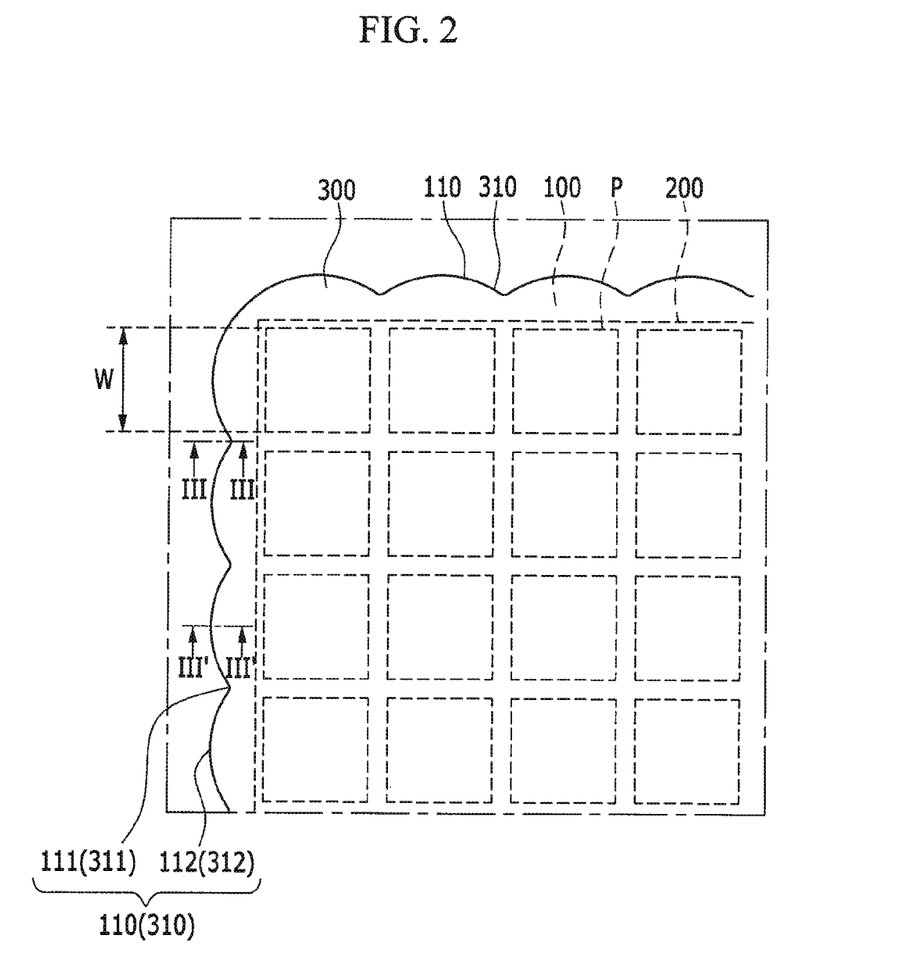
FIG. 2 is an enlarged view of part A of FIG. 1.

FIG. 2 is an enlarged view of part A of FIG. 1. FIG. 3A is a cross-sectional view taken along the line III-III of FIG. 2, and FIG. 3B is a cross-sectional view taken along the line III'-III' of FIG. 2.

Figure 3:
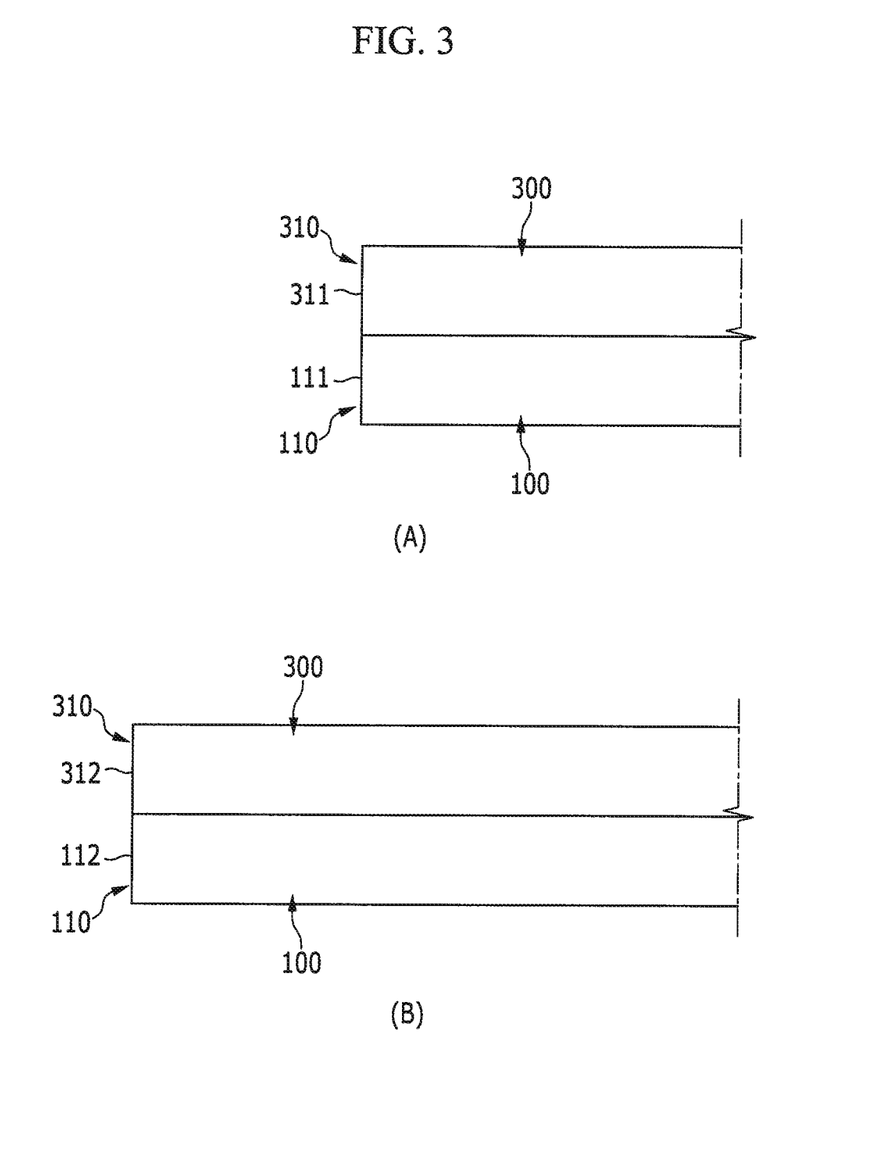
FIGS. 3A and 3B are cross-sectional views taken along the lines III-III and III'-III' of FIG. 2, respectively.

As illustrated in FIGS. 2 and 3, a first edge 110 of the first substrate 100 and a second edge 310 of the second substrate 300 are attached together.

The first substrate 100 includes the first edge 110 having wave patterns on a plane surface (i.e., the first wave-shaped edge 110).

The first edge 110 includes a first depressed portion 111 and a first protruding portion 112, which are disposed alternately to each other. The first protruding portion 112 protrudes in a curved shape and the first depressed portion 111 extends in a depressed way from the first protruding portion 112 (i.e., is between corresponding first protruding portions). The first depressed portion 111 has a pointed shape in the direction of the display 200. The first depressed portion 111 (depressed with a pointed shape in the direction of the display 200) and the first protruding portion 112 (extending from the first depressed portion 111 and protruding in a curved shape) are disposed alternately to each other, and thus the first edge 110 has a wave shape.

The second substrate 300 includes the second edge 310 having wave patterns on a plane surface (i.e., the second wave-shaped edge 310) corresponding to the first edge 110. In detail, the second edge 310 and the first edge 110 are disposed on a virtual straight line, respectively. In other words, the end of the first edge 110 and the end of the second edge 310 meet together at a suitable (e.g., a predetermined) point.

The second edge 310 includes a second depressed portion 311 and a second protruding portion 312, which are disposed alternately to each other. The second protruding portion 312 protrudes in a curved shape and the second depressed portion 311 extends in a depressed way from the second protruding portion 312. The second depressed portion 311 has a pointed shape in the direction of the display 200. The second depressed portion 311 (depressed with a pointed shape in the direction of the display 200) and the second protruding portion 312 (extending from the second depressed portion 311 and protruding in a curved shape) are disposed alternately to each other, and thus the second edge 310 has a wave shape.

Accordingly, since the first substrate 100 and the second substrate 300 may be constituted by a flexible film, the display device 1000 may be implemented as a thin flexible display device. In thin flexible display devices, stress may be concentrated on an edge of the display device due to the flexibility, and thus, the edge of the first substrate and the edge of the second substrate, which are bonded together, may be separated from each other due to the stress. However, in the thin flexible display device 1000 according to the first exemplary embodiment, the first edge 110 of the first substrate 100 and the second edge 310 of the second substrate 300, which are bonded together, have a wave shape, and thus, the stress concentrated on each of the first edge 110 and the second edge 310 is distributed. Therefore, the first edge 110 and the second edge 310 are inhibited (or suppressed or prevented) from being separated from each other due to stress.

The first protruding portion 112 of the first edge 110 and the second protruding portion 312 of the second edge 310 may each have a width W corresponding to a pixel P, which configures the display 200. Accordingly, the impact resistance of a side of the pixel P, which is a minimum unit of displaying an image, is improved over the impact resistance between adjacent pixels P. Therefore, if the first edge 110 and the second edge 310 each have a wave shape, an overall impact resistance of the display device 1000 is improved.

The display 200 is located between the first substrate 100 and the second substrate 300, and displays an image through a plurality of pixels P.

Figure 4:
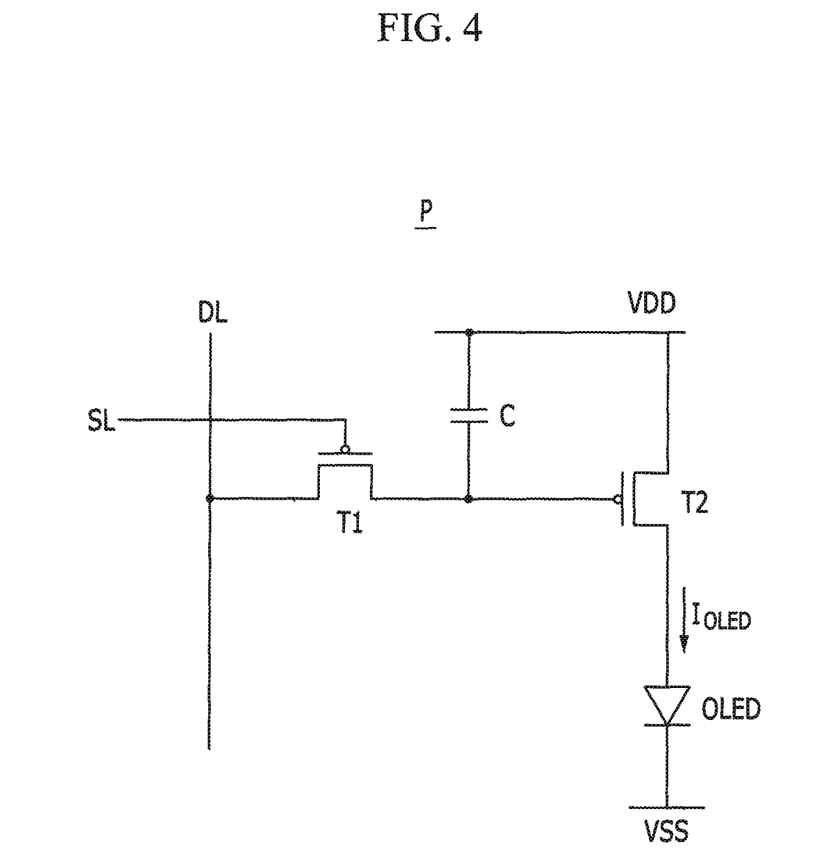
FIG. 4 is a circuit diagram illustrating a pixel of a display illustrated in FIG. 2.

FIG. 4 is a circuit diagram illustrating a pixel of a display illustrated in FIG. 2.

As illustrated in FIG. 4, the pixel P, according to an embodiment of the present invention, includes at least two thin film transistors T1, T2, at least one capacitor C, and an organic light emitting diode (OLED). The two thin film transistors may include a switching thin film transistor T1 and a driving thin film transistor T2.

The switching thin film transistor T1 may be connected to a scan line (SL) and a data line (DL), and may transmit, to the driving thin film transistor T2, a data voltage, which is input from the data line (DL), according to a switching voltage, which is input into the scan line (SL). The capacitor (C) may be connected to the switching thin film transistor T1 and a driving power line (VDD), and may store a voltage corresponding to a difference between a voltage received from the switching thin film transistor T1 and a voltage supplied to the driving power line (VDD).

The driving thin film transistor T2 may be connected to the driving power line (VDD) and the capacitor (C), so that the driving thin film transistor T2 supplies, to an organic light emitting diode, an output current ($I_{OELD}$), which is proportional to a square of a difference between a voltage stored in the capacitor (C) and a threshold voltage, and the organic light emitting diode emits light according to the output current ($I_{OELD}$) and a current supplied from the common power line (VSS).

As described above, even if the display device 1000 according to the first exemplary embodiment is implemented as a thin flexible display device with the first substrate 100 and the second substrate 300 including (e.g., constituted by) a flexible film, the first edge 110 of the first substrate 100 and the second edge 310 of the second substrate 300, which are bonded together, have a wave shape, respectively, and thus the stress concentrated on each of the first edge 110 and the second edge 310 is distributed. Therefore, the first edge 110 and the second edge 310 are inhibited from being separated from each other due to stress.

Further, in the display device 1000 according to the first exemplary embodiment, the first protruding portion 112 of the first edge 110 and the second protruding portion 312 of the second edge 310 have a width (W) corresponding to a pixel (P) so that the impact resistance of a side of the pixel (P) is improved over the impact resistance between adjacent pixels (P). Therefore, if the first edge 110 and the second edge 310 have a wave shape, an overall impact resistance of the display device 1000 is improved.

In other words, the thin flexible display device 1000 having improved impact resistance as a whole is provided.

Hereinafter, a display device according to a second exemplary embodiment will be described with reference to FIGS. 5 to 7.

Hereinafter, only specific portions that are different from those of the first exemplary embodiment are described in detail, and the description of the remaining portions are given by way of reference to the embodiments described above. Further, in the second exemplary embodiment, the same reference numerals as those of the first exemplary embodiment will be used for the same components for better comprehension and ease of description.

Figure 5:
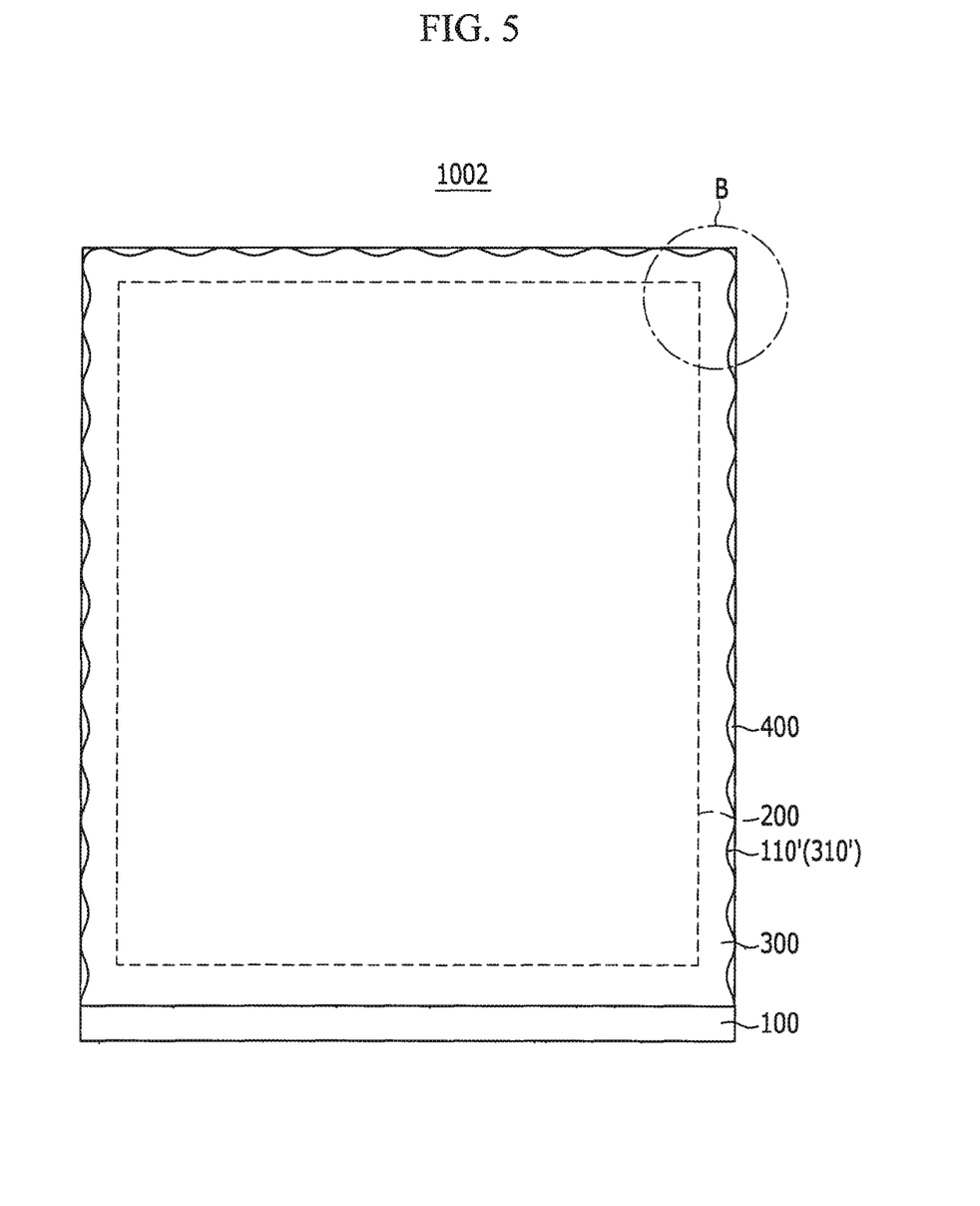
FIG. 5 is a diagram illustrating a display device according to a second exemplary embodiment.

FIG. 5 is a diagram illustrating the display device according to the second exemplary embodiment. FIG. 6 is an enlarged view of part B of FIG. 5. FIG. 7A is a cross-sectional view taken along the line VII-VII of FIG. 6, and FIG. 7B is a cross-sectional view taken along the line VII'/VII' of FIG. 6.

Figure 6:
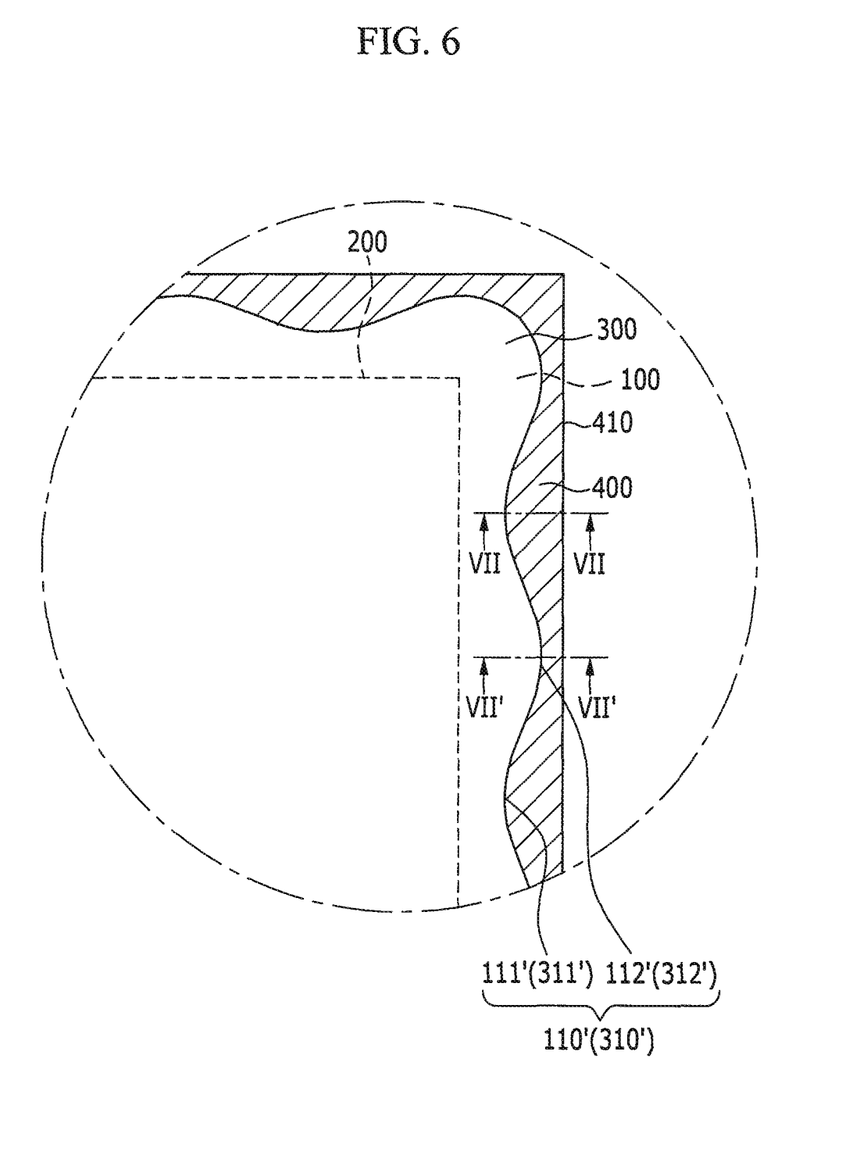
FIG. 6 is an enlarged view of part B of FIG. 5.
Figure 7:
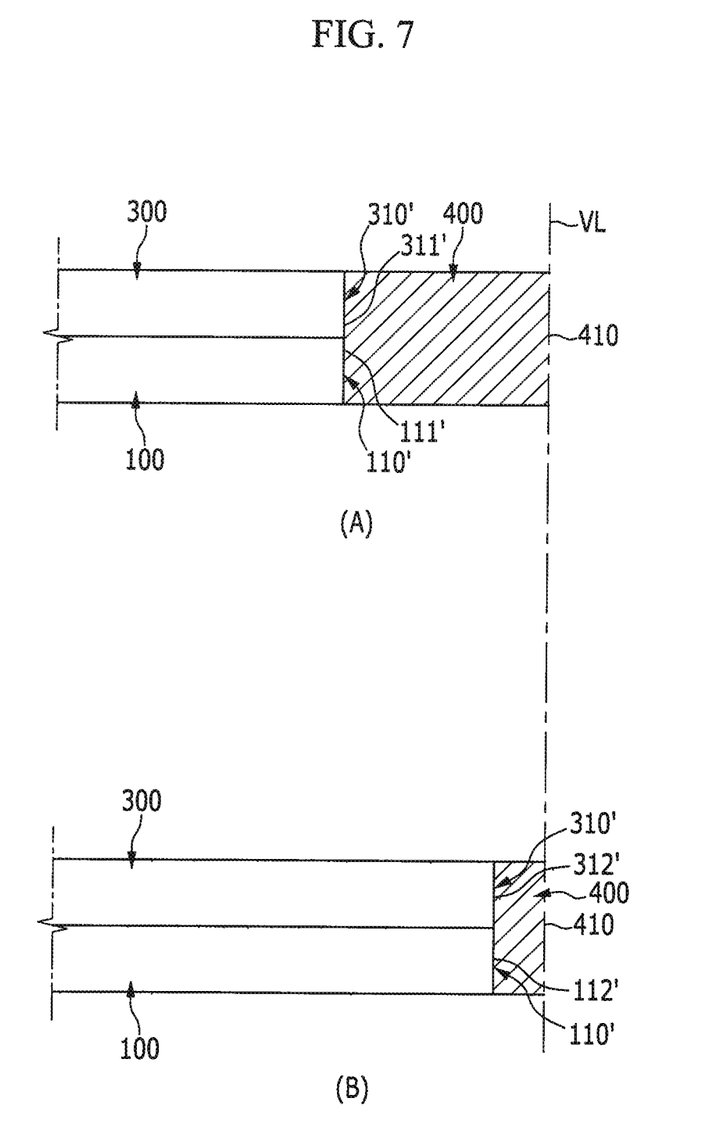
FIGS. 7A and 7B are cross-sectional views taken along the lines VII-VII and VII'-VII' of FIG. 6, respectively.

As shown in FIGS. 5 to 7, a display device 1002 according to the second exemplary embodiment includes a first substrate 100, a display 200, a second substrate 300 and a reinforcing agent 400.

A first edge 110' includes a first depressed portion 111' and a first protruding portion 112', both of which are disposed alternately to each other. The first protruding portion 112' protrudes in a curved shape, and the first depressed portion 111' extends in a depressed way from the first protruding portion 112'. The first depressed portion 111' has a curved shape in the direction of the display 200. The first depressed portion 111' (depressed with a curved shape in the direction of the display 200) and the first protruding portion 112' (extending from the first depressed portion 111' and protruding in a curved shape) are disposed alternately to each other, and thus, the first edge 110' has a wave shape.

The second substrate 300 includes a second wave-shaped edge 310' having wave patterns on a plane surface corresponding to the first edge 110'. In detail, the second edge 310' and the first edge 110' are disposed on a virtual straight line, respectively. In other words, the ends of the first edge 110' and the second edge 310' meet together in an identical (or substantially identical) shape.

The second edge 310' includes a second depressed portion 311' and a second protruding portion 312', which are disposed alternately to each other. The second protruding portion 312' protrudes in a curved shape and the second depressed portion 311' extends in a depressed way from the second protruding portion 312'. The second depressed portion 311' has a curved shape in the direction of the display 200. The second depressed portion 311' (depressed with a curved shape in the direction of the display 200) and the second protruding portion 312' (extending from the second depressed portion 311' and protruding in a curved shape) are disposed alternately to each other, and thus, the second edge 310' has a wave shape.

The reinforcing agent 400 may be attached to the first edge 110' of the first substrate 100 and the second edge 310' of the second substrate 300, and may include a first straight line-shaped reinforcing edge 410. The reinforcing agent 400 may be made of, for example, an organic material, such as a resin, or an inorganic material, such as an oxide.

As illustrated in FIG. 6, the first reinforcing edge 410 may have a straight line shape. Accordingly, as illustrated in FIG. 7A, the first reinforcing edge 410 of the reinforcing agent 400 that is attached to the first depressed portion 111' of the first edge 110' and the second depressed portion 311' of the second edge 310' is disposed on the same virtual line (VL) as the first reinforcing edge 410 of the reinforcing agent 400 that is attached to the first protruding portion 112' of the first edge 110' and the second protruding portion 312' of the second edge 310', as illustrated in FIG. 7B.

As described above, if the display device 1002 according to the second exemplary embodiment is implemented as a thin flexible display device with the first substrate 100 and the second substrate 300 including (e.g., constituted by) a flexible film, the first edge 110' of the first substrate 100 and the second edge 310' of the second substrate 300, which are bonded together, have a wave shape, and simultaneously (or concurrently) the reinforcing agent 400 is attached to each of the first edge 110' and the second edge 310'. Here, the reinforcing agent 400 reinforces the rigidity of the first substrate 100 and the second substrate 300. Therefore, the first substrate 100 and the second substrate 300 are inhibited (or suppressed or prevented) from being damaged due to an external impact. In other words, overall rigidity of the display device 1002 may be increased, thereby improving the reliability of handling the display device 1002.

Further, in the display device 1002 according to the second exemplary embodiment, the reinforcing agent 400 is attached to each of the first edge 110' of the first substrate 100 and the second edge 310' of the second substrate 300, which are bonded together, so that the first edge 110' of the first substrate 100 and the second edge 310' of the second substrate 300 are inhibited (or suppressed or prevented) from being separated from each other due to stress.

In addition, in the display device 1002 according to the second exemplary embodiment, the reinforcing agent 400 may be attached to the first edge 110' and the second edge 310' to inhibit moisture from the outside from being permeated between the first edge 110' and the second edge 310'.

Accordingly, the thin flexible display device 1002 having improved impact resistance as a whole is provided.

Hereinafter, a display device according to a third exemplary embodiment will be described with reference to FIGS. 8 and 9.

Hereinafter, only specific portions that are different from those of the first exemplary embodiment are described, and the descriptions of the remaining portions are given by way of reference to the preceding embodiments. Further, in the third exemplary embodiment, for better comprehension and ease of description, the same constituent elements are designated by the same reference numerals as the first exemplary embodiment.

Figure 8:
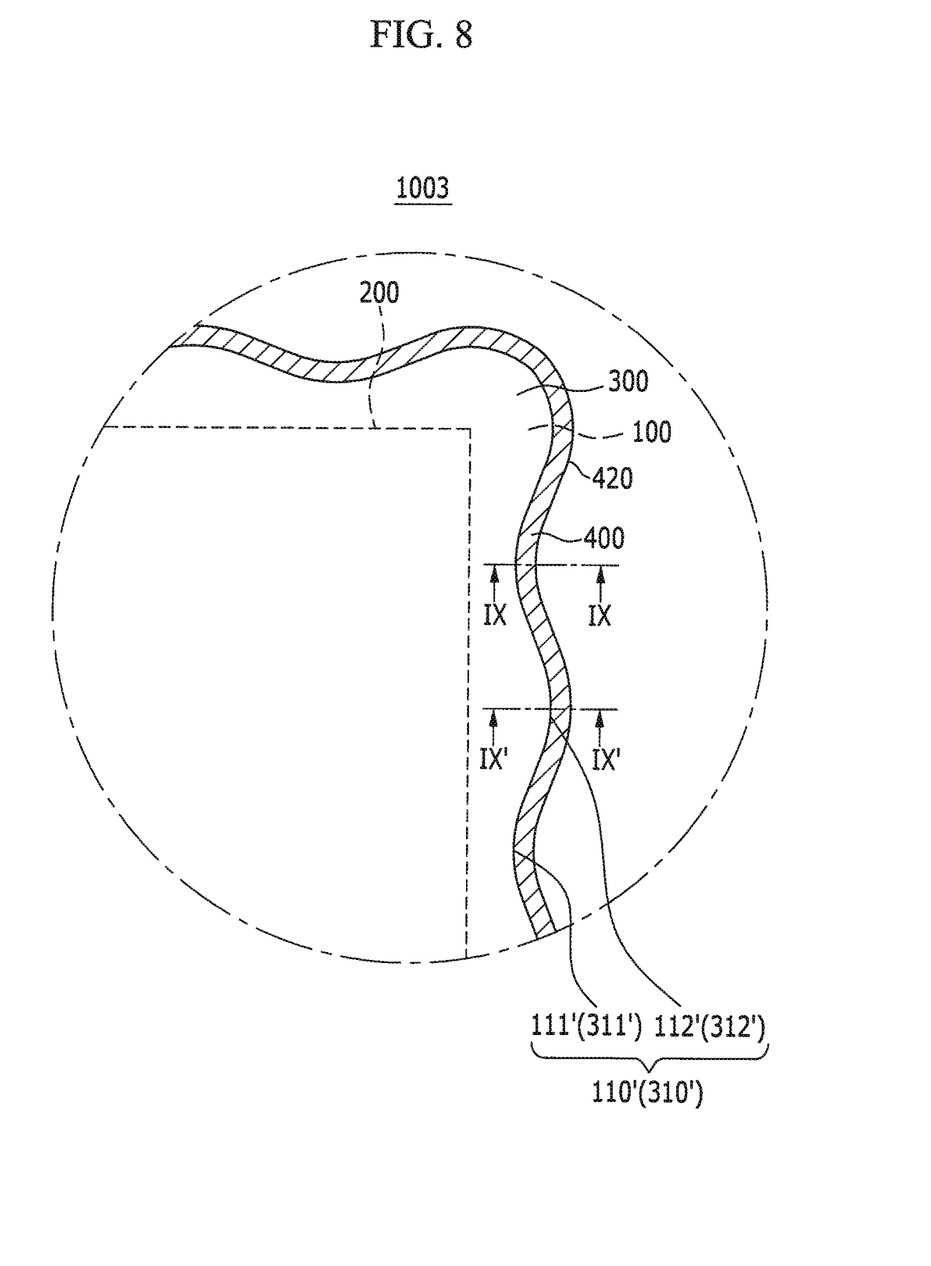
FIG. 8 is a diagram illustrating a part of a display device according to a third exemplary embodiment.

FIG. 8 is a diagram illustrating a part of the display device according to the third exemplary embodiment. FIG. 9A is a cross-sectional view taken along the line IX-IX of FIG. 8, and FIG. 9B is a cross-sectional view taken along the line IX'-IX' of FIG. 8.

Figure 9:
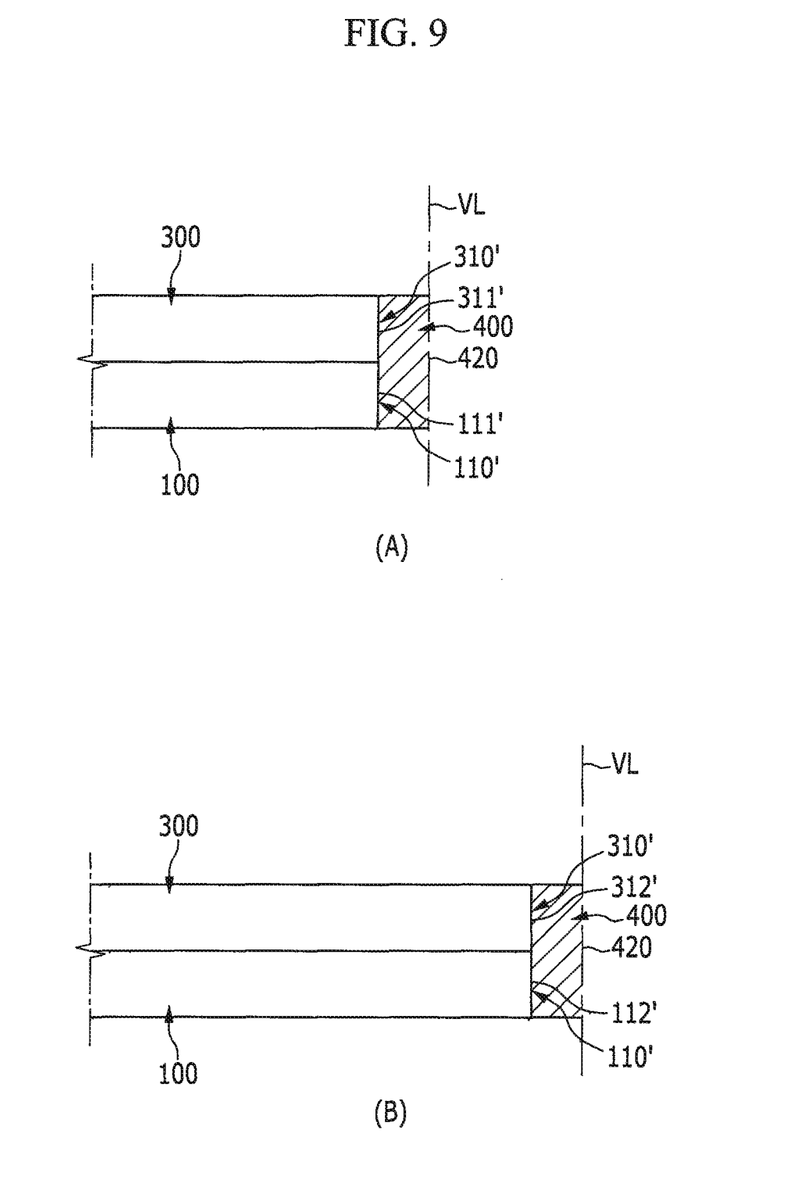
FIGS. 9A and 9B are cross-sectional views taken along the lines IX-IX and IX'-IX' of FIG. 8, respectively.

As illustrated in FIGS. 8 and 9, a display device 1003 according to the third exemplary embodiment includes a first substrate 100, a display 200, a second substrate 300, and a reinforcing agent 400.

The reinforcing agent 400 may be attached to a first edge 110' of the first substrate 100 and a second edge 310' of the second substrate 300, and may include a second wave-shaped reinforcing edge 420 corresponding to the first edge 110' and the second edge 310'. The reinforcing agent 400 may be made of, for example, an organic material, such as a resin, or an inorganic material, such as an oxide.

As illustrated in FIG. 8, the second reinforcing edge 420 has a wave shape. Accordingly, as illustrated in FIG. 9A, the second reinforcing edge 420 of the reinforcing agent 400 that is attached to a first depressed portion 111' of the first edge 110' and attached to a second depressed portion 311' of the second edge 310' is disposed on a different virtual line (VL) from the second reinforcing edge 420 of the reinforcing agent 400 that is attached to a first protruding portion 112' of the first edge 110' and a second protruding portion 312' of the second edge 310', as illustrated in FIG. 9B.

As described above, if the display device 1003 according to the third exemplary embodiment is implemented as a thin flexible display device with the first substrate 100 and the second substrate 300 including (e.g., constituted by) a flexible film, the first edge 110' of the first substrate 100 and second edge 310' of the second substrate 300, which are bonded together, have a wave shape, and simultaneously (or concurrently) the reinforcing agent 400 is attached to each of the first edge 110' and the second edge 310', so that the reinforcing agent 400 reinforces the rigidity of the first substrate 100 and the second substrate 300. Therefore, the first substrate 100 and the second substrate 300 are inhibited (or suppressed or prevented) from being damaged due to an external impact. In other words, overall rigidity of the display device 1003 is increased, thereby improving the reliability of handling the display device 1003.

Further, in the display device 1003 according to the third exemplary embodiment, the reinforcing agent 400 is attached to the first edge 110' of the first substrate 100 and the second edge 310' of the second substrate 300, which are bonded together, so that the first edge 110' of the first substrate 100 and the second edge 310' of the second substrate 300 are inhibited (or suppressed or prevented) from being separated from each other due to stress.

In addition, in the display device 1003 according to the third exemplary embodiment, the reinforcing agent 400 may be attached to the first edge 110' and the second edge 310' to inhibit moisture from the outside from being permeated between the first edge 110' and the second edge 310'.

Furthermore, in the display device 1003 according to the third exemplary embodiment, the reinforcing agent 400 includes the second wave-shaped reinforcing edge 420, and thus the stress concentrated on the second reinforcing edge 420 is distributed, so that the reinforcing agent 400 is inhibited (or suppressed or prevented) from being separated from the first edge 110' and the second edge 310' due to stress.

Accordingly, the thin flexible display device 1003 having improved impact resistance as a whole is provided.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims and their equivalents.

What is claimed is:

1. A display device, comprising:
a first substrate comprising a first wave-shaped edge, the first wave-shaped edge comprising a plurality of first protruding portions each protruding in a curved shape and a plurality of first depressed portions each between corresponding ones of the first protruding portions, the first protruding portions and the first depressed portions being disposed alternately to each other;
a display on the first substrate and configured to display an image; and
a second substrate on the first substrate with the display interposed therebetween, and comprising a second wave-shaped edge bonded to the first wave-shaped edge and corresponding to the first wave-shaped edge.

2. A display device of claim 1, comprising:
a first substrate comprising a first wave-shaped edge, the first wave-shaped edge comprising a plurality of first protruding portions each protruding in a curved shape and a plurality of first depressed portions each depressed in a curved shape and between corresponding ones of the first protruding portions, the first protruding portions and the first depressed portions being disposed alternately to each other;
a display on the first substrate and configured to display an image; and
a second substrate on the first substrate with the display interposed therebetween, and comprising a second wave-shaped edge bonded to the first wave-shaped edge and corresponding to the first wave-shaped edge.

3. The display device of claim 1, wherein:
the second wave-shaped edge comprises: a plurality of second protruding portions each protruding in a curved shape; and a plurality of second depressed portions each between corresponding second protruding portions, and
the second protruding portions and the second depressed portions are disposed alternately to each other.

4. The display device of claim 1, wherein:
the display comprises a plurality of pixels, each pixel being a minimum unit for displaying the image, and
each first protruding portion and each second protruding portion have a width corresponding to a width of one of the pixels.

5. The display device of claim 1, further comprising:
a reinforcing agent attached to the first wave-shaped edge and the second wave-shaped edge.

6. The display device of claim 5, wherein:
the reinforcing agent comprises a first reinforcing edge in a straight line.

7. The display device of claim 5, wherein:
the reinforcing agent comprises a second wave-shaped reinforcing edge corresponding to the first wave-shaped edge and the second wave-shaped edge.

8. The display device of claim 1, wherein:
the display comprises an organic light emitting diode.

9. The display device of claim 8, wherein:
the first substrate and the second substrate each comprise a flexible film.

10. The display device of claim 1, wherein:
each of the first protruding portions is wider than each of the first depressed portions.

* * * * *